Figure 1:
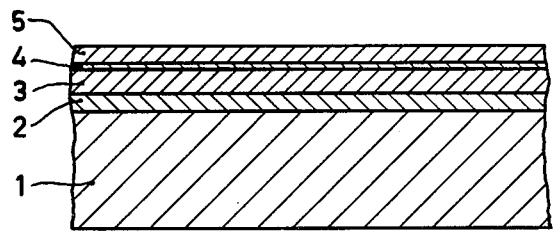

United States Patent [19]

Nijman et al.

[11] 4,137,107

[45] Jan. 30, 1979

[54] METHOD OF MANUFACTURING A SEMICONDUCTOR DEVICE UTILIZING SELECTIVE MASKING, DEPOSITION AND ETCHING

[75] Inventors: Willem Nijman; Peter J. de Waard, both of Eindhoven, Netherlands

[73] Assignee: U.S. Philips Corporation, New York, N.Y.

[21] Appl. No.: 818,312

[22] Filed: Jul. 25, 1977

[30] Foreign Application Priority Data

Aug. 30, 1976 [NL] Netherlands .................. 7609607

[51] Int. Cl.² .................. H01L 21/308; H01L 21/208
[52] U.S. Cl. .................. 148/171; 29/569 L; 29/578; 29/580; 148/172; 148/175; 156/654; 156/655; 156/662; 357/16; 357/18; 357/56
[58] Field of Search .................. 148/171, 172, 175; 357/16, 18, 56; 156/654, 655, 662; 29/569 L, 578, 580

[56] References Cited

U.S. PATENT DOCUMENTS

| | | | |
|---|---|---|---|
| 3,824,493 | 7/1974 | Hakki | 357/18 X |
| 3,833,435 | 9/1974 | Logan et al. | 148/175 X |
| 3,849,790 | 11/1974 | Gottsmann et al. | 331/94.5 H X |
| 3,893,044 | 7/1975 | Dumke et al. | 331/94.5 |
| 3,915,765 | 10/1975 | Cho et al. | 148/175 |
| 3,938,172 | 2/1976 | Lockwood | 357/18 |
| 3,961,996 | 6/1976 | Namizaki et al. | 148/171 |
| 4,011,113 | 3/1977 | Thompson et al. | 148/175 |

OTHER PUBLICATIONS

Tsukada, T., "GaAs–Ga$_{1-x}$Al$_x$As . . . Lasers" J. Applied Physics, vol. 45, No. 11, Nov. 1974, pp. 4899–4906.

Dumke et al., "Double-Heterojunction GaAs Injection Laser" I.B.M. Tech. Discl. Bull., vol. 15, No. 6, Nov. 1972, p. 1998.

Lee et al., "Low-Threshold . . . Heterostructure Laser" Applied Physics Letters, vol. 29, No. 6, Sep. 1976, pp. 365–367.

*Primary Examiner*—L. Dewayne Rutledge
*Assistant Examiner*—W.G. Saba
*Attorney, Agent, or Firm*—Thomas A. Briody; Steven R. Biren

[57] ABSTRACT

The invention relates to a method in which a system of layers with a contact layer of gallium arsenide is formed epitaxially. In a second epitaxy treatment a layer of gallium aluminum arsenide is formed selectively. In order not to form the latter layer on the contact layer of gallium arsenide, the latter is shielded from gallium aluminum arsenide by means of a masking layer having a composition which differs from that of the layer to be provided selectively, so that the masking layer can afterwards be removed selectively.

3 Claims, 4 Drawing Figures

METHOD OF MANUFACTURING A SEMICONDUCTOR DEVICE UTILIZING SELECTIVE MASKING, DEPOSITION AND ETCHING

The invention relates to a method of manufacturing a semiconductor device in which, in a first epitaxy process, a system of layers is formed epitaxially on a substrate, which system of layers comprises a first layer of gallium aluminum arsenide, the system of layers is removed locally and the substrate is exposed partly and, in a second epitaxy process, a second layer of gallium aluminum arsenide is formed selectively on the exposed parts of the substrate. The invention also relates to a semiconductor device manufactured by means of the method.

Such semiconductor devices may be, for example, laser diodes, light-emissive diodes and photodiodes.

A method of the kind mentioned is known from Journal of Applied Physics, 45, 4899–4906 (1974). The starting material is, for example, a gallium arsenide substrate consisting of a single monocrystalline body or of such a body which is provided with an epitaxial layer of the same material. The body or the epitaxial layer is successively provided epitaxially with a layer of gallium aluminum arsenide, a layer of gallium arsenide and the said first layer of gallium aluminum arsenide. Mesas are then formed by local removal of the system of layers.

The second layer of gallium aluminum arsenide to be formed in the second epitaxy process may be deposited on the gallium arsenide substrate but is usually not formed on the said first layer of gallium aluminum arsenide.

This is the case when the first layer of gallium aluminum arsenide has a main face having small crystallographic indices in which the side faces of the mesas are covered with the second layer of gallium aluminum arsenide at areas where they consist of gallium aluminum arsenide as well as at areas where they consist of gallium arsenide.

For contacting the first layer of gallium aluminum arsenide it is desirable for said layer to be provided with a contact layer of gallium arsenide, and that simply as a part of the first epitaxy process.

However, the second layer of gallium aluminum arsenide is also deposited on the contact layer of gallium arsenide, after which the second layer of gallium aluminum arsenide is to be removed selectively from the contact layer of gallium arsenide. The drawback of this is that extra process steps are necessary including inter alia an accurate alignment step.

One of the objects of the invention is to avoid the said extra process steps. It is based on the recognition of the fact that during the first epitaxy process a suitable masking layer can be provided on the contact layer of gallium arsenide to be formed.

Therefore, the method mentioned above is characterized according to the invention in that during the first epitaxy process a contact layer of gallium arsenide and a masking layer of gallium aluminum arsenide having a composition differing from that of the second layer of gallium aluminum arsenide to be formed are formed on the first layer of gallium aluminum arsenide, the contact layer and the masking layer with the system of layers are removed locally and parts of the masking layer remaining after the second epitaxy process are removed selectively.

In order to be able to contact also the second layer of gallium aluminum arsenide in a modified embodiment of the method according to the invention the second layer of gallium aluminum arsenide is provided with a layer of gallium arsenide during the second epitaxy process. Said gallium arsenide does not grow on the masking layer because this has been exposed to the atmosphere between the two epitaxy processes.

The invention will now be described in greater detail with reference to the accompanying drawing and an example.

Figure 2:
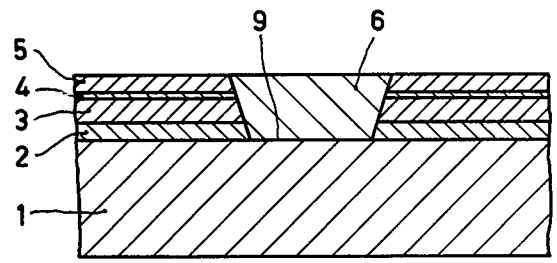
Figure 3:
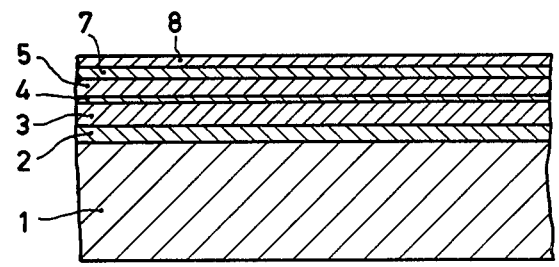
Figure 4:
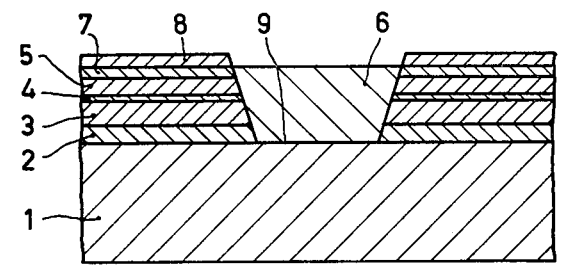

In the drawing, FIGS. 1 and 2 are diagrammatic sectional views of a part of a semiconductor device in successive stages of manufacture by means of a known method of the kine mentioned, FIGS. 3 and 4 are diagrammatic sectional views of a part of a semiconductor device in successive stages of manufacture by means of the method according to the invention.

In a known method of manufacturing a semiconductor device, a system of layers 2, 3, 4, 5 is formed in a first epitaxy process on a substrate 1 (see FIGS. 1 and 2), which system of layers comprises a first layer 5 of gallium aluminum arsenide. The system of layers 2, 3, 4, 5 is removed locally and the substrate 1 is exposed partly.

In a second epitaxy process, a second layer 6 of gallium aluminum arsenide is formed selectively on exposed parts 9 of the substrate.

According to the invention, during the first epitaxy process a contact layer 7 (see FIGS. 3 and 4) of gallium arsenide and a masking layer 8 of gallium aluminum arsenide having a composition differing from that of the second layer 6 of gallium aluminum arsenide to be formed is formed on the first layer 15 of gallium aluminum arsenide.

The contact layer 7 and the masking layer 8 are removed locally with the system of layers 2, 3, 4, 5. After the second epitaxy process, remaining parts of the masking layer 8 are removed selectively.

Starting material in the invention is, for example, an n-type monocrystalline body 1 of gallium arsenide having a net charge carrier concentration $n_D - n_A = 10^{18}$ per cm$^3$, which in order to improve the crystal perfection of a polished and etched (100) face, is provided in a usual manner by liquid phase epitaxy with an n-type gallium arsenide layer 2 of a few $\mu$m thickness and $n_D - n_A = 10^{18}$ per cm$^3$ and then with an n-type layer 3 of gallium aluminum arsenide having a composition Ga$_{0.7}$AL$_{0.3}$As, a thickness of 2 $\mu$m and $n_D - n_A = 5 \cdot 10^{17}$ per cm$^3$, an active p-type layer 4 of gallium arsenide having a thickness of 0.3$\mu$m and $n_A - n_D + 5 \cdot 10^{17}$ per cm$^3$, a p-type so-called first layer 5 of gallium aluminum arsenide having a composition Ga$_{0.7}$Al$_{0.3}$As, a thickness of 1–1.5$\mu$m and $n_A - n_D = 5 \cdot 10^{17}$ per cm$^3$, a p-type contact layer 7 of gallium arsenide having a thickness of 1$\mu$m and $n_A - n_D = 2 \cdot 10^{18}$ per cm$^3$ and a p-type masking layer 8 of gallium aluminum arsenide having a composition Ga$_{0.5}$Al$_{0.5}$As, a thickness of 1$\mu$and $n_A - n_D = 5 \cdot 10^{17}$ per cm$^3$. The layers 2, 3, 4, 5, 7 and 8 are locally etched through by means of a usual photoetching method. In the etching bath used, which consists of 3 parts by volume of 96% by weight of H$_2$SO$_4$, 1 part by volume of 30% by weight of H$_2$O$_2$ and 1 part by volume of H$_2$O, a uniform etching of gallium arsenide and gallium aluminum arsenide takes place, so that substantially no underetching of one layer with respect to the other occurs.

In the formation of the second n-type layer 6 of gallium aluminum arsenide having a composition $Ga_{0.8}Al_{0.2}As$ and $n_D - n_A = 5 \cdot 10^{17}$ per cm$^3$ the deposition takes place not only on the exposed parts 9 but also uniformly on the edges of the layers 2, 3, 4, 5, 7 and not on the layer 8.

The compositions of the layers 6 and 8 are sufficiently different in order that in the subsequent treatment in an etching bath consisting of 37% by weight of HCl at 60° C. layer 8 is removed selectively with respect to layer 6.

The resulting semiconductor body may be provided in various manners with contacts dependent on the ultimately desired structure which in this case is a laser structure having a buried active layer.

For mesas the provision of contacts on layer 7 and the substrate 1 may be sufficient.

For laser structures having lateral injection a contact on layer 6 is desired, for which purpose the second layer of gallium aluminum arsenide is provided with a layer of gallium arsenide during the second epitaxy process. Such a layer of gallium arsenide does not grow on the masking layer because this has been exposed to air after the first epitaxy process. The masking layer can be removed particularly simply with respect to the layer of gallium arsenide provided in the second epitaxy process while using conventional etching baths.

The structure to be manufactured need not be a mesa structure. If the method according to the invention is carried out on a semiconductor disc, the disc may be divided through the center of the mesas.

Semiconductor devices for use in optical communication systems and in integrated optics can be manufactured by means of the method according to the invention.

What is claimed is:

1. A method of manufacturing a semiconductor device which comprises:

providing a semiconductor substrate having a major surface;

forming an epitaxial system of layers on said major surface in a first epitaxy process by forming a plurality of epitaxial layers on said major surface, forming a gallium arsenide contact layer on said plurality of layers and forming a gallium aluminum arsenide masking layer on said contact layer;

locally removing said epitaxial system of layers down to said major surface at selected locations to expose selected portions of said major surface;

selectively forming a localized layer of gallium aluminum arsenide on the exposed portions of said major surface in a second epitaxy process, the composition of said localized gallium aluminum arsenide layer being sufficiently different from that of said gallium aluminum arsenide masking layer so that the masking layer can be selectively removed with respect to the localized layer by asubsequent etching treatment; and selectively removing portions of said masking layer by an etching treatment.

2. A method as claimed in claim 1, further comprising the steps of exposing the gallium aluminum arsenide masking layer to the atmosphere after the first epitaxy process and locally forming a layer of gallium arsenide on said localized layer of gallium aluminum arsenide during the second epitaxy process.

3. A method as claimed in claim 1, wherein the step of forming the plurality of epitaxial layers of said epitaxial system of layers on said major surface further comprises the steps of consecutively forming, on said major surface, a first layer of gallium arsenide, a first layer of gallium aluminum arsenide, a second layer of gallium arsenide and a second layer of gallium aluminum arsenide.

* * * * *